United States Patent
Fakhry et al.

(10) Patent No.: US 6,668,359 B1
(45) Date of Patent: Dec. 23, 2003

(54) VERILOG TO VITAL TRANSLATOR

(75) Inventors: Nader Fakhry, Fort Collins, CO (US); Viswanathan Lakshmanan, Westminster, CO (US)

(73) Assignee: LSI Logic Corporation, Milpitas, CA (US)

( * ) Notice: Subject to any disclaimer, the term of this patent is extended or adjusted under 35 U.S.C. 154(b) by 188 days.

(21) Appl. No.: 10/003,823

(22) Filed: Oct. 31, 2001

(51) Int. Cl.$^7$ .............................................. G06F 17/50
(52) U.S. Cl. .................................. 716/3; 716/7; 716/18
(58) Field of Search .................................. 716/3, 18, 7

(56) References Cited

U.S. PATENT DOCUMENTS

| | | | | |
|---|---|---|---|---|
| 5,029,102 | A | * 7/1991 | Drumm et al. | 716/18 |
| 5,956,256 | A | * 9/1999 | Rezek et al. | 716/3 |
| 5,999,734 | A | * 12/1999 | Willis et al. | 717/149 |
| 6,026,226 | A | * 2/2000 | Heile et al. | 716/12 |
| 6,051,031 | A | * 4/2000 | Shubat et al. | 716/3 |
| 6,148,436 | A | * 11/2000 | Wohl | 716/18 |
| 6,226,780 | B1 | * 5/2001 | Bahra et al. | 716/18 |
| 6,233,723 | B1 | * 5/2001 | Pribetich | 716/17 |
| 6,272,664 | B1 | * 8/2001 | Chang et al. | 716/3 |
| 6,272,671 | B1 | * 8/2001 | Fakhry | 716/18 |
| 6,292,931 | B1 | * 9/2001 | Dupenloup | 716/18 |
| 6,421,818 | B1 | * 7/2002 | Dupenloup et al. | 716/18 |
| 6,496,955 | B1 | * 12/2002 | Chandra et al. | 716/3 |
| 6,584,598 | B2 | * 6/2003 | Rao et al. | 716/2 |
| 2003/0074640 | A1 | * 4/2003 | Mandell et al. | 716/3 |
| 2003/0084410 | A1 | * 5/2003 | Rankin | 716/3 |

FOREIGN PATENT DOCUMENTS

| | | | | |
|---|---|---|---|---|
| JP | 08115357 | A | * 5/1996 | G06F/17/50 |
| WO | WO 9953530 | A2 | * 10/1999 | |

OTHER PUBLICATIONS

Shaw et al., "Deriving accurate ASIC cell fault models for VITAL compliant VHDL simulation", The 2001 IEEE International Symposium on Circuits and Systems, vol. 5, May 6, 2001, pp. 263–266.*

Shaw et al., "Automated defect to fault translation for ASIC standard cell libraries", 2001 IEEE Pacific Rim Conference on Communications, Computers and Signal Processing, vol. 1, Aug. 26, 2001, pp. 291–294.*

Dossis et al., "Synthesis of customised hardware from ADA", 1994 IEEE International Symposium on Circuits and Systems, Vo 1, May 30 1994, pp. 229–232.*

(List continued on next page.)

*Primary Examiner*—Matthew Smith
*Assistant Examiner*—Phallaka Kik
(74) *Attorney, Agent, or Firm*—Fitch, Even, Tabin & Flannery

(57) ABSTRACT

A method of translating a register transfer level code model includes receiving as inputs a user defined primitives map file, a truth table map file, a gate primitives map file, a register transfer level description file of a library cell, a standard delay format file, and a pin order information file for the register transfer level code model; creating data structures for a VITAL model; parsing at least one of the user defined primitives map file, the truth table map file, the gate primitives map file, the register transfer level description file, and the standard delay format file to generate an equivalent VITAL model in the data structures created for the VITAL model wherein the VITAL model is functionally equivalent to the register transfer level code model; and generating as output a VITAL model file from the data structures created for the VITAL model.

12 Claims, 5 Drawing Sheets

OTHER PUBLICATIONS

Lee et al., "Design of new DSP instructions and their hardware architecture for high-speed FFT", 2001 IEEE Workshop: Signal Processing Systems, Sep. 26, 2001, pp. 80–90.*

Economakos et al., "Behavioral synthesis with SystemC", Proceedings of Design, Automation and Test in Europe, 2001 Conference and Exhibition, Mar. 13, 2001, pp. 21–25.*

Smith, "Writing style for architectural synthesis", Proceedings of 1995 IEEE International Verilog HDL Conference, Mar. 27, 1995, pp. 106–113.*

Sharma et al., "Timing modeling of datapath layout for synthesis", 1994 International Verilog HDL Conference, Mar. 14, 1994, pp. 80–84.*

* cited by examiner

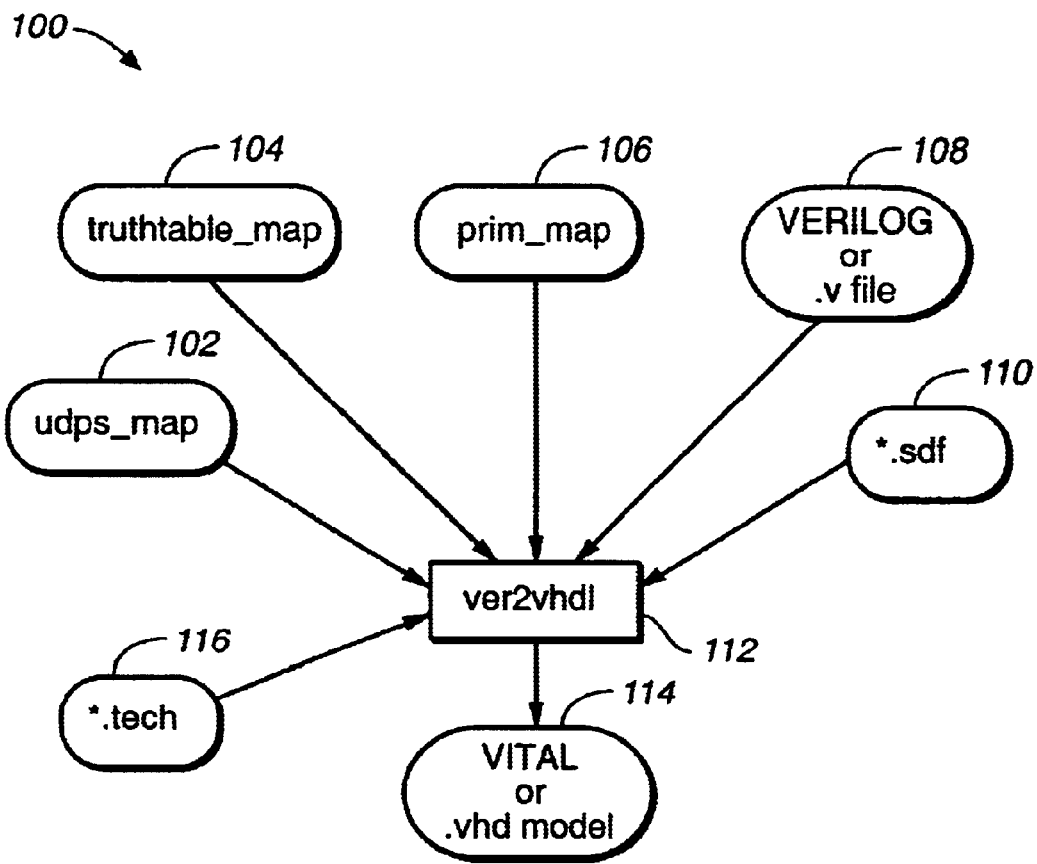
FIG._1

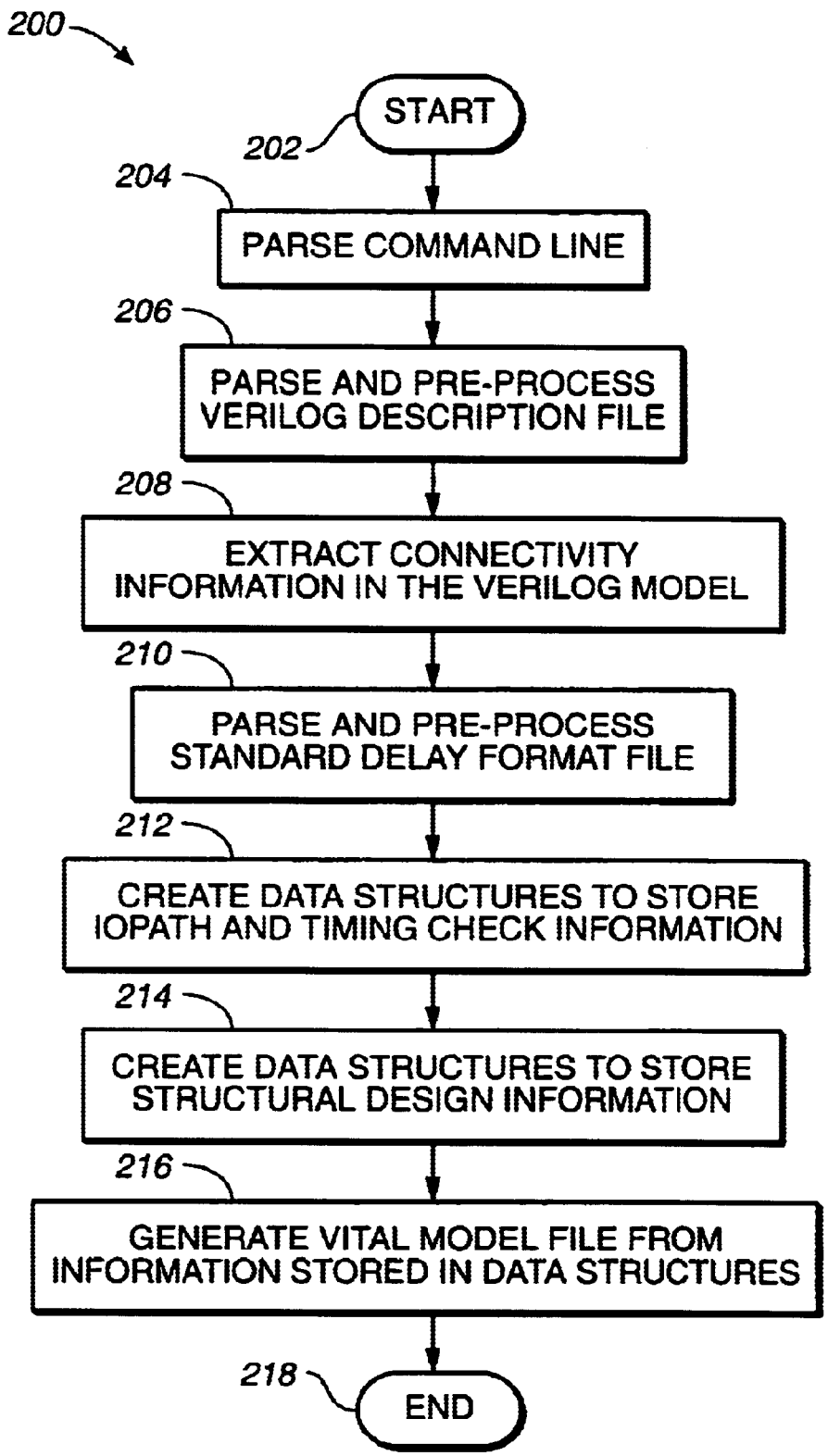
FIG._2

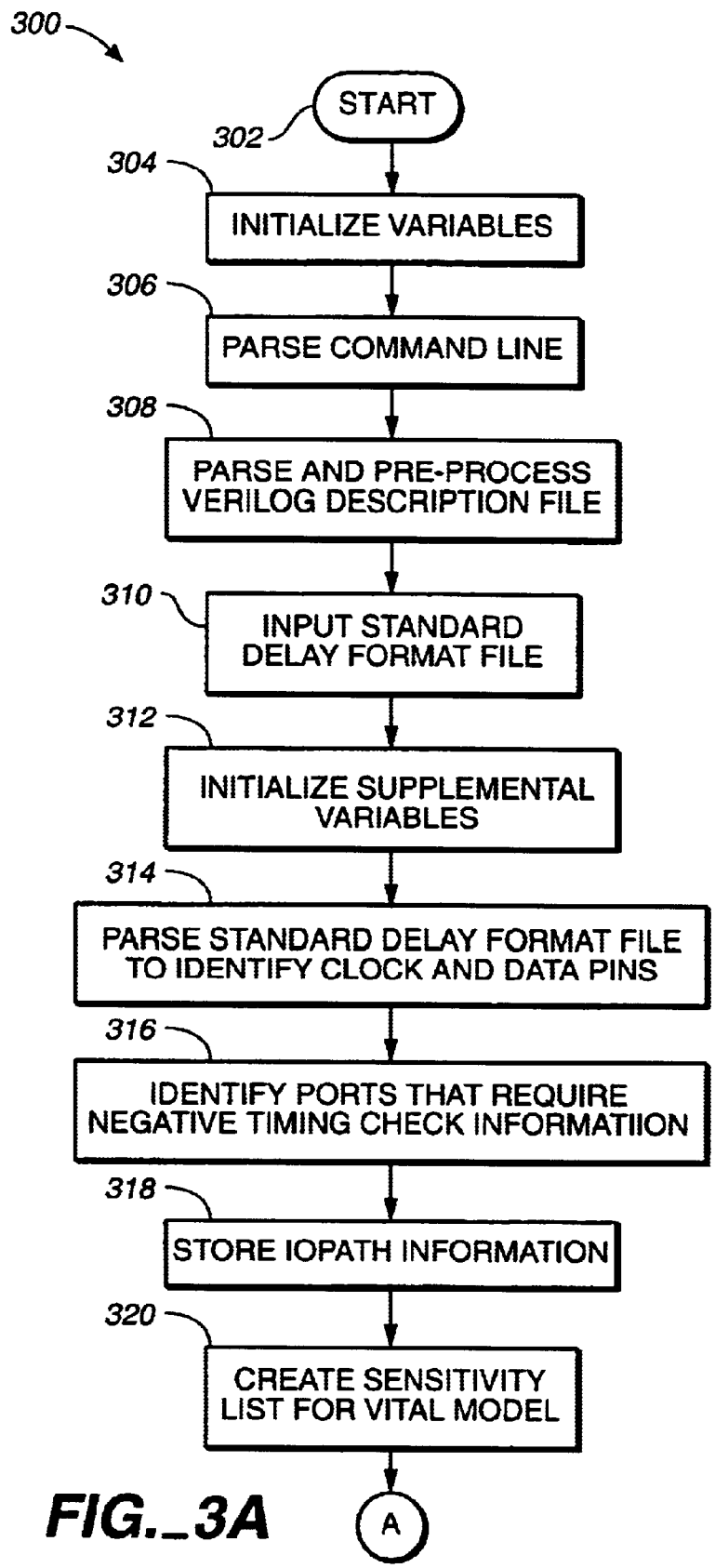
FIG._3A

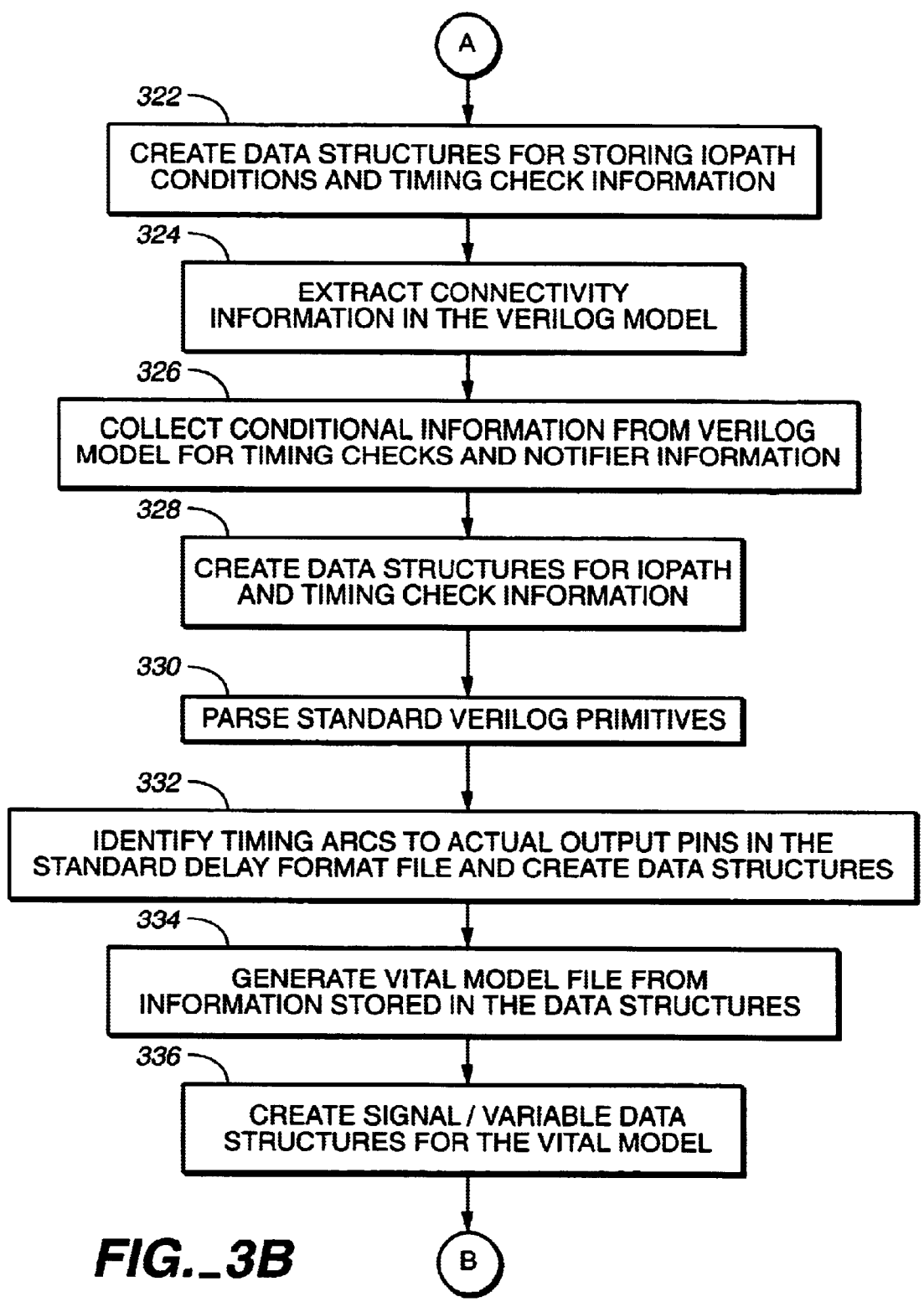
FIG._3B

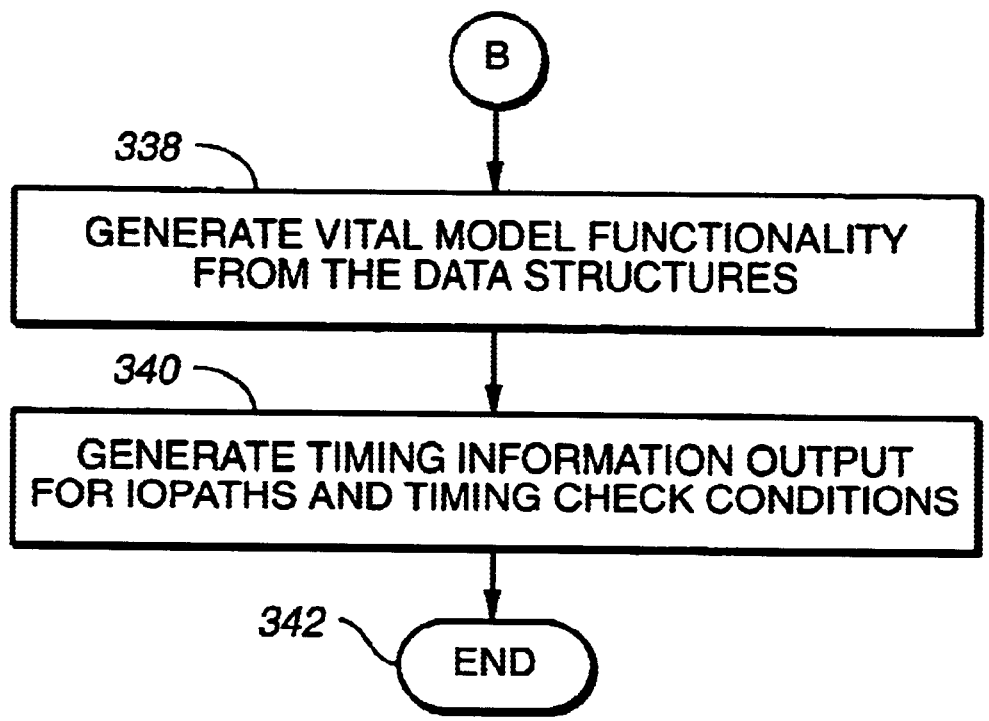
FIG._3C

VERILOG TO VITAL TRANSLATOR

REFERENCE TO COMPUTER PROGRAM LISTING APPENDIX

The following computer program listing files are submitted on a compact disc and are incorporated herein by reference:

| NAME | CREATION DATE | SIZE (bytes) |
| --- | --- | --- |
| Appendix.txt | Aug. 25, 2003 | 136,921 |

FIELD OF THE INVENTION

The present invention relates generally to electronic design automation (EDA) tools. More specifically, but without limitation thereto, the present invention relates to translating a description of a circuit from a design model format into an EDA format.

SUMMARY OF THE INVENTION

In one aspect of the present invention, a method includes receiving as inputs a user defined primitives map file, a truth table map file, a gate primitives map file, a register transfer level description file of a library cell, a standard delay format file, and a pin order information file for the register transfer level code model; creating data structures for a VITAL model; parsing at least one of the user defined primitives map file, the truth table map file, the gate primitives map file, the register transfer level description file, and the standard delay format file to generate an equivalent VITAL model in the data structures created for the VITAL model wherein the VITAL model is functionally equivalent to the register transfer level code model; and generating as output a VITAL model file from the data structures created for the VITAL model.

BRIEF DESCRIPTION OF THE DRAWINGS

The present invention is illustrated by way of example and not limitation in the figures illustrated in the accompanying drawings. The drawings are not drawn to any particular scale and are not intended to impart dimensional or proportional relationships which are not explicitly indicated. Similar elements are indicated by like references in the figures, wherein:

FIG. 1 is a block diagram illustrating data flow of a VERILOG to VITAL translator according to an embodiment of the present invention;

FIG. 2 is a high level flow chart of the VERILOG to VITAL translator of FIG. 1; and FIG. 3 is a detailed flow chart illustrating an implementation of the functional flow chart of FIG. 2.

The Appendix contains a listing of an exemplary computer program written in PERL script for the flow chart of FIG. 3.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

The Very High Speed Integrated Circuit (VHSIC) Hardware Description Language (VHDL) Initiative Towards ASIC Libraries, commonly referred to by its abbreviated form, VITAL, is a standard for Application Specific Integrated Circuit (ASIC) libraries that has become widely adopted in electronic design automation (EDA) for modeling circuit designs for systems on a chip (SoC). One of the main areas in which ASIC designers can influence design productivity is in the selection of a register transfer level (RTL) code. If the RTL code obeys basic coding guidelines, it becomes a much easier task to automatically drive the synthesis and physical layout tools without repeated iterations and interaction between the system house and the ASIC vendor. A popular example of such an RTL code is the VERILOG format. A need therefore exists for translating a circuit design rendered in VERILOG format into the VITAL standard to serve the primary objective of VITAL, to accelerate the development of sign-off quality ASIC macrocell simulation libraries written in VHDL by leveraging existing methodologies of model development.

In one aspect of the present invention, a user defined primitives (UDP) map file, a truth table map file, a gate primitives map file, a VERILOG description file, a standard delay format file, and a techfile are received as input. A VITAL model is generated as output that includes delay and timing information and is equivalent in functionality to the VERILOG description model described in the VERILOG description file.

FIG. 1 is a block diagram illustrating data flow of a VERILOG to VITAL translator according to an embodiment of the present invention. Shown in FIG. 1 are a user defined primitives (UDP) map file 102, a truth table map file 104, a gate primitives map file 106, a VERILOG description file 108, a standard delay format file 110, a VERILOG to VITAL translator 112, a VITAL model file 114, and a TECHFILE 116.

The user defined primitives (UDP) map file 102 maps previously created VERILOG user defined primitives (UDP) to previously created VHSIC Hardware Description Language (VHDL) equivalents and also specifies the number of inputs for each user defined primitive. A user defined primitive defines logic functionality in the form of a table and is typically used as an alternative that is simpler than representing logic functionality using gate primitives. In a user defined primitive, the state of the output may be derived from a combination of input values and the previous value of the output.

The truth table map file 104 also maps previously created VHSIC user defined primitives (UDP) to previously created VHSIC Hardware Description Language (VHDL) equivalents and also specifies the number of inputs for each user defined primitive. Each truth table has a table structure that is used to derive and define logic functionality. Unlike a user defined primitive (UDP), however, the state of the output of a truth table in a VITAL model is independent of the previous value of the output.

The gate primitives map file 106 maps basic gate primitives used in the VERILOG description file 108 into equivalent VITAL primitives.

The VERILOG description file 108 contains the design of a specific cell, such as a cell from a cell library, in VERILOG hardware description language format. The VERILOG description file 108 also includes functional and timing information for the cell. The timing information includes propagation delay and timing check information. The TECHFILE 116 contains the pin order information and other instance-specific process information.

The standard delay format file 110 is created, for example, by a delay calculation tool according to well known techniques and contains information specific to the timing characteristics of the cell, such as IOPATH (input to output) delays, timing check windows, and interconnect delay information based on the loads connected to the output of the cell. The standard delay format file 110 also explicitly defines conditional IOPATHS for the cell, if applicable.

The VERILOG to VITAL translator 112 receives as input the user defined primitives (UDP) map file 102, the truth table map file 104, the gate primitives map file 106, the VERILOG description file 108, the standard delay format file 110, and the TECHFILE 116 and creates data structures to store the information received. The information stored in the data structures is processed to create the VITAL model file 114 that is equivalent in functionality to the VERILOG model described in the VERILOG description file and also includes selected delay and timing information. The method of translating a design model format illustrated by the data flow chart 100 may be implemented as illustrated in the following functional flow chart.

FIG. 2 is a functional flow chart 200 of the VERILOG to VITAL translator of FIG. 1.

Step 202 is the entry point of the flow chart 200.

In step 204, the command line invoking the VERILOG to VITAL translator 112 is parsed.

In step 206, the VERILOG description file 108 is parsed and pre-processed.

In step 208, the connectivity information in the VERILOG model is deciphered.

In step 210, the standard delay format file 110 is parsed and pre-processed.

In step 212, data structures are created to store IOPATH delay information and timing check information.

In step 214, data structures are created to store structural design information that includes port, functionality and delay and timing information for the VITAL model.

In step 216, the information stored in the data structures is generated as output in VITAL format to the VITAL model file 114. As alternative or in addition to the output file, the VITAL model may be printed, for example, in VHDL format.

Step 218 is the exit point of the flow chart 200.

FIG. 3 is a detailed flow chart 300 illustrating an implementation of the functional flow chart 200 of FIG. 2. The flow chart 300 includes corresponding line numbers of the PERL script computer program listing contained in the Appendix.

Step 302 is the entry point for the flow chart 300.

In step 304 (lines 15–79 in the Appendix), the variables used by the VERILOG to VITAL translator 112 are initialized. The variables used herein are placeholders for the computer program to store information including, for example, library technology, the VERILOG description file to be translated, location of the mapping files, initialization of counters used to keep track of primitives, inputs, delayed and non-delayed versions of signals, table-header information, flags, and VITAL keywords.

In step 306 (lines 86–381 in the Appendix), the command line invoking the VERILOG to VITAL translator 112 is parsed. An example of a command line is as follows:

ver2vhdl <cell_name> <technology> where <cell_name> is parsed as the name of the cell defined by the VERILOG model to be translated, and <technology> is parsed as the name of the library technology to which the cell belongs.

In step 308, the VERILOG description file 108 is parsed and pre-processed. The pre-processing includes identifying module name, i.e., cell name information, pinout information, and replacing the delayed version of the primary input signals used for negative timing checks in the VERILOG model with the non-delayed primary input signals. The same pre-processing also applies to the timing checks section of the VERILOG model, that is, the delayed version of the primary input signals also appears in the functional and timing-check section of the VERILOG model, and the delayed version of the primary input signals is replaced in both the functional section and the timing checks section with the non-delayed version of the primary input signals.

In step 310 (lines 388–418 in the Appendix), the Standard Delay Format (SDF) file for a specific load on the cell described in the VERILOG description file 108 is received as input.

In step 312 (lines 420–481 in the Appendix), supplemental variables are initialized for the VITAL keywords, flags are set based on conditional information, and comments are inserted to be printed out in the VITAL model.

In step 314 (lines 487–513 in the Appendix), the Standard Delay Format file is parsed to identify clock and data pins.

In step 316 (lines 516–1152 in the Appendix), ports are identified in the standard delay format file that require negative timing check information, and the port names are modified by the appropriate suffix "-dly" or "-ipd". The suffix "-dly" is used for ports to represent an internal signal delay or an internal clock delay. The suffix "-ipd" is used for all primary input ports to enable the back-annotation of interconnect path delays (ipd) to the corresponding port.

In step 318, information is stored from the VERILOG description file regarding conditions on the IOPATHS, i.e., the conditions on path delay from an input pin to an output pin.

In step 320, a sensitivity list is created for the VITAL model that is used for IOPATHS and timing checks. A sensitivity list is a list of signals in a process block of the VITAL model. The term "sensitivity" means that whenever any of the signals in the sensitivity list changes, the simulator executes the functional behavior described in the process block.

In step 322, data structures are created for storing information defining the IOPATHS conditions and timing checks from the VERILOG model. A HOLD timing check may be mapped to a REMOVAL if the HOLD timing check is not accompanied by a mapping SETUP, for example, to provide seamless operation in specific versions of an ASIC design kit. A HOLD timing check is performed to ensure that a data signal is valid for a certain time period after the clock pulse transition. A SETUP timing check is performed to ensure that the data signal is valid for a certain time period before the clock pulse transitions. A REMOVAL timing check is similar to a HOLD, except that it is used to check HOLD times for a data signal that is asynchronous with respect to the clock pulse.

In step 324 (lines 1160–1640 in the Appendix), the connectivity information defining the connections among the ports, internal signals, user defined primitives, and gate primitives that define the functionality of the VERILOG description file is extracted to create appropriate data structures for the VITAL model. The connectivity information from the VERILOG model is stored in the data structures as the equivalent VITAL information.

In step 326 (lines 1648–1900 in the Appendix), conditional information is collected from the VERILOG model for timing checks and all notifier information. Notifiers are single bit registers or "flags" that change state when a timing check violation is detected. The conditional information is then stored in the appropriate data structures.

In step 328 (lines 1906–1933 in the Appendix), the appropriate data structures are created for the IOPATH delay and timing check information to be used in generating the VITAL model.

In step 330 (lines 1935–2021 in the Appendix), the standard VERILOG primitives are parsed from the VERILOG description file and the primitives information is stored in the appropriate data structures for the VITAL model equivalents.

In step 332 (lines 2023–2048 in the Appendix), timing arcs to actual output pins in the Standard Delay Format file are identified and the appropriate VITAL data structures are created depending on whether the corresponding IOPATH (timing arc) is present.

In step 334 (lines 2055–2637 in the Appendix), the information stored in various data structures is used to generate a VITAL-compliant VHSIC Hardware Description Language (VHDL) model. The module name, i.e., cell name, and pin information are generated as output, for example, to a file or to a printer.

In step 336, the appropriate SIGNAL/VARIABLE data structures are created for the VITAL model. A SIGNAL in a VITAL model is used to interconnect concurrent elements of the design and is similar to a wire on a circuit schematic. SIGNALs may also be initialized to a specific value. A VARIABLE is an object to store intermediate values between sequential statements in the VITAL model. VARIABLEs are only allowed in a PROCESS, a FUNCTION, and a PROCEDURE, which are the building blocks of a VITAL model, and are local to these blocks.

In step 338, the appropriate GENERICs are created for the VITAL model. A GENERIC is a parameter in the VITAL model that is used within a section or portion of the VITAL model to describe additional instance-specific information about that section or portion, similar to an entity or component declaration.

In step 338, the VITAL model functionality is generated as output from the information formatted in the data structures created in the previous steps. The VITAL model functionality is the functional description of the behavior of the VERILOG model translated into VITAL format. The functional behavior of the VITAL model in a VITAL simulator is the same as the functional behavior of the VERILOG model in a VERILOG simulator.

In step 340, the timing information for the VITAL model is generated as output for IOPATHS (with and without delay conditions) and for timing checks (with and without delay conditions).

Step 342 is the exit point for the flow chart 300.

The following lines of code in the Appendix perform subroutine functions for the steps described above:

In lines 2650–2666, logic signal values are mapped to the corresponding VITAL/VHDL equivalents.

In lines 2669–2775, conditional information in the IOPATHS (timing arcs) is parsed from the Standard Delay Format file.

In lines 2778–2829, the Standard Delay Format file is parsed for information about IOPATHS (timing arcs) in the Standard Delay Format file, and relevant pin and conditional information is stored in data structures created for the VITAL model.

In lines 2831–2844, the Standard Delay Format file is parsed for "width" information. The "width" information is a part of the standard timing check information in which the signal width, i.e., the time during which the signal is asserted, is validated. The parsed "width" information is stored in the appropriate data structures for the VITAL model.

In lines 2846–2867, the Standard Delay Format file is parsed for RECOVERY information on each pin, and the RECOVERY information is stored in the appropriate data structures for the VITAL model. The RECOVERY information is similar to the SETUP timing check, except that it is used for signals that are asynchronous with respect to the clock pulse.

In lines 2869–2935, the Standard Delay Format file is parsed for HOLD, SETUP, and SKEW information on each pin, and the information is stored in the appropriate data structures for the VITAL model. A HOLD timing check ensures that a data signal is valid for a certain time period after the clock pulse transition. A SETUP timing check ensures that the data signal is valid for a certain time period before the clock pulse transitions. A SKEW timing check verifies or validates the allowable delay between two signals. A SKEW timing check violation occurs when the delay between the two signals exceeds the allowable delay.

In lines 2937–2961, the Standard Delay Format file is parsed to determine which VITAL generic category to fit the IOPATH, and the category information is stored in the appropriate data structures for the VITAL model.

In lines 2964–3096, the VERILOG model is parsed to extract timing check information and stores the timing check information in the appropriate data structures created for the VITAL model.

In lines 3098–3114, a check is made to determine whether the polarity of each of the input/output signals in a timing check is a rising edge or a falling edge, and the polarity information is stored in the appropriate data structures created for the VITAL model.

In lines 3116–3126, the list of the signal names in the sensitivity list is checked to ensure that no signal is listed more than once as an error check. In lines 3128–3171, the pin order in the VITAL/VHDL model is checked to ensure that it matches that of the TECHFILE 116 in FIG. 1. The TECHFILE is parsed in this step for the pin order information.

In lines 3173–3226, the appropriate INPUT/OUTPUT/ INOUT pin information is created for the VITAL model from the TECHFILE information, which also includes process information and such specific to the cell.

In lines 3229–3249, each User Defined Primitive (UDP) is mapped to an equivalent VITAL/VHDL UDP and the appropriate properties are defined for the equivalent VITAL/ VHDL UDP.

In lines 3251–3303, the equivalent VITAL/VHDL UDP for the VERILOG model is generated as output with a copyright notice.

In lines 3305–3318, string manipulation is performed for parsing the VERILOG and Standard Delay Format files and for storing information into data structures.

For portability and maintainability, the flow chart 300 may be implemented in a widely used programming language such as Practical Extraction and Report Language (PERL) script, however, other programming languages such as C/C++ may be used to suit specific applications. PERL script has a simple, readable format and is portable between different computer operating systems used, for example, with Sun and Hewlett-Packard computers.

In this example, a VERILOG model was translated to a VITAL model, however other register transfer level (RTL)

codes may be similarly parsed into VITAL data structures to generate VITAL models in accordance with the present invention to suit specific applications.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by a computer according to well known programming techniques to perform the following functions: receiving as inputs a user defined primitives (UDP) map file, a truth table map file, a gate primitives map file, a VERILOG description file of a library cell, and a standard delay format file for a VERILOG model; creating data structures for a VITAL model; parsing at least one of the user defined primitives (UDP) map file, the truth table map file, the gate primitives map file, the VERILOG description file, and the standard delay format file to generate an equivalent VITAL model in the data structures created for the VITAL model; and generating as output a VITAL model file from the data structures created for the VITAL model.

The computer program described above may be, for example, a Practical Extraction and Report Language (PERL) script, however, other programming languages may be used to implement the embodiments of the present invention described above to suit specific applications.

Other modifications, variations, and arrangements of the present invention may be made in accordance with the above teachings other than as specifically described to practice the invention within the spirit and scope defined by the following claims.

What is claimed is:

1. A method of translating a register transfer level code into VITAL format comprising:
   receiving as inputs a user defined primitives map file, a truth table map file, a gate primitives map file, a VERILOG description file of a library cell, a standard delay format file, and a pin order information file for a VERILOG model;
   creating data structures for a VITAL model;
   parsing at least one of the user defined primitives map file, the truth table map file, the gate primitives map file, the VERILOG description file, the standard delay format file, and the pin order information file to generate a VITAL model within the data structures created for the VITAL model wherein the VITAL model is functionally equivalent to the VERILOG model; and
   generating as output a VITAL model file from the data structures created for the VITAL model.

2. The method of claim 1 further comprising replacing delayed primary input signals in the VERILOG description file with non-delayed primary input signals.

3. The method of claim 1 further comprising storing IOPATH conditions and timing check information in at least one of the data structures created for the VITAL model.

4. The method of claim 1 further comprising creating a sensitivity list for the VITAL model.

5. The method of claim 1 further comprising extracting connectivity information from the VERILOG description file.

6. The method of claim 5 wherein the connectivity information includes ports, internal signals, user defined primitives, and gate primitives.

7. A computer program product for translating a register transfer level code into VITAL format comprising:
   a medium for embodying a computer program for input to a computer; and
   a computer program embodied in the medium for causing the computer to perform the following functions:
      receiving as inputs a user defined primitives map file, a truth table map file, a gate primitives map file, a VERILOG description file of a library cell, a standard delay format file, and a pin order information file for a VERILOG model;
      creating data structures for a VITAL model;
      parsing at least one of the user defined primitives map file, the truth table map file, the gate primitives map file, the VERILOG description file, the standard delay format file, and the pin order information file to generate an equivalent VITAL model within the data structures created for the VITAL model wherein the VITAL model is functionally equivalent to the VERILOG model; and
      generating as output a VITAL model file from the data structures created for the VITAL model.

8. The computer program product of claim 7, the functions further comprising replacing delayed primary input signals in the VERILOG description file with non-delayed primary input signals.

9. The computer program product of claim 7, the functions further comprising storing IOPATH conditions and timing check information in at least one of the data structures created for the VITAL model.

10. The computer program product of claim 7, the functions further comprising creating a sensitivity list for the VITAL model.

11. The computer program product of claim 7, the functions further comprising deciphering connectivity information from the VERILOG description file.

12. The computer program product of claim 11 wherein the connectivity information includes ports, internal signals, user defined primitives, and gate primitives.

* * * * *